United States Patent [19]

Morey

[11] Patent Number: 4,500,841
[45] Date of Patent: Feb. 19, 1985

[54] UNIVERSAL INSTRUMENT FLAG RECEIVER

[75] Inventor: William A. Morey, Marion, Iowa

[73] Assignee: Rockwell International Corporation, El Segundo, Calif.

[21] Appl. No.: 417,007

[22] Filed: Sep. 13, 1982

[51] Int. Cl.³ .......................................... H03K 5/153
[52] U.S. Cl. ................................. 328/146; 307/350; 307/362; 328/150
[58] Field of Search ............... 307/350, 362, 354, 475; 328/146, 147, 148, 150

[56] References Cited

U.S. PATENT DOCUMENTS 3,665,217 5/1972 Adams et al. ...................... 307/362
3,906,259 9/1975 Nicholas et al. ...................... 307/350
3,919,565 11/1975 Clark et al. ........................... 307/350

Primary Examiner—John Zazworsky
Attorney, Agent, or Firm—Richard W. Anderson; Robert C. Mayes; H. Fredrick Hamann

[57] ABSTRACT

A flag receiver circuitry for either a low level or a high level flag input is described. By utilizing the common mode rejection capability that must be incorporated in a differential flag receiver circuit, the same circuit can be connected as a single ended input receiver for a high level flag by effecting a clamp of the inverting input terminal voltage of the differentially configured operational amplifier employed to provide a high level flag trippoint output.

4 Claims, 3 Drawing Figures

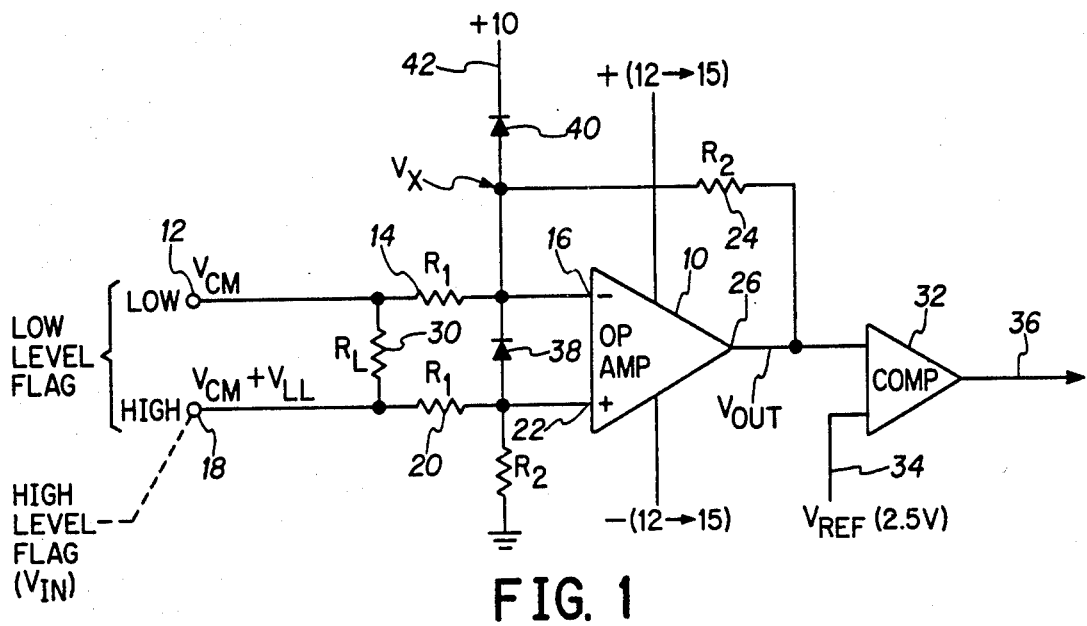
FIG. 1
FIG. 2
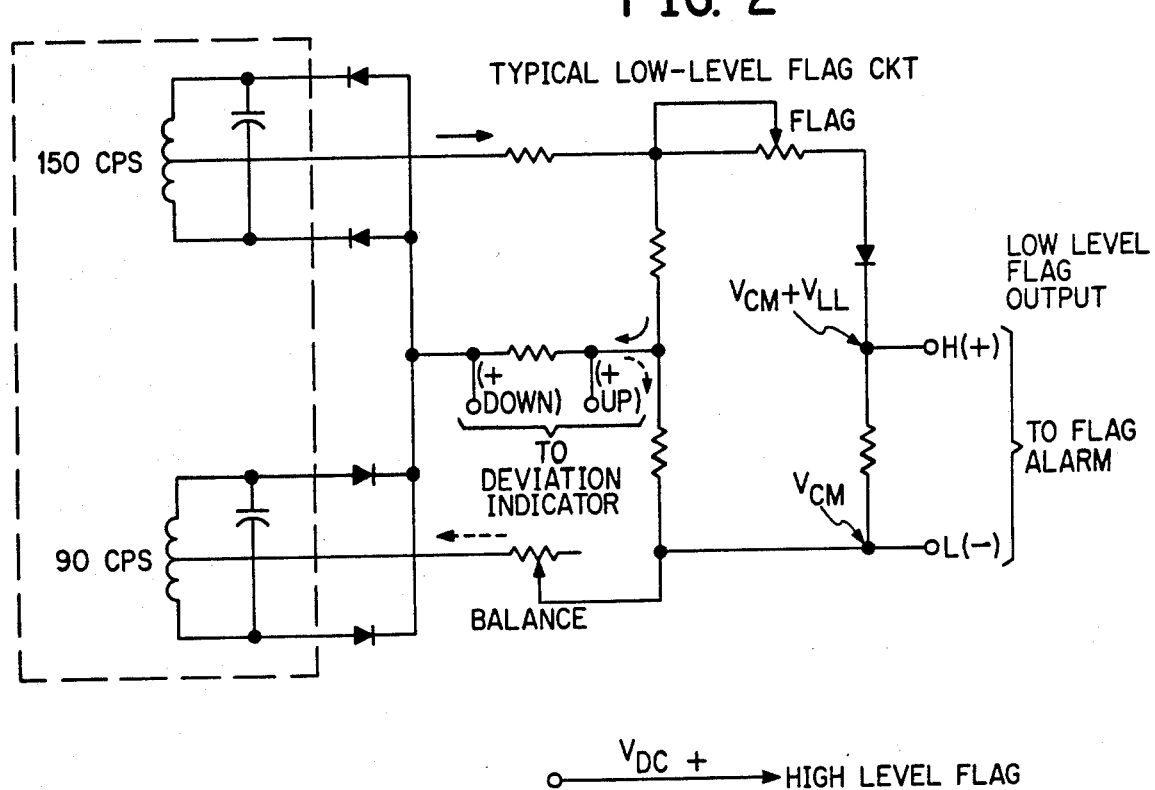
FIG. 3

UNIVERSAL INSTRUMENT FLAG RECEIVER

This invention relates generally to signal receiving circuitry and, more particularly, to an improved aircraft instrument flag warning receiver circuit which may be connected as an input receiver for either an ARINC defined 2-wire low-level differential flag input signal or a single ended high-level flag input signal.

In the past, aircraft instruments were designed to accept only one level of flag warning input signal, and, if interface to another flag level was needed, a flag buffer or flag amplifier had to be added.

Accordingly, the object of the present invention is to provide a universal flag receiver circuit for an aircraft instrument which will interface directly with either a differential two-wire low-level flag input or a single ended high level flag input to provide flag warning annunciation for the instrument.

The present invention is featured in the use of an operational amplifier connected in differential amplifier configuration with common mode input signal rejection, with means for clamping the signal applied to the non-inverting input terminal of the operational amplifier at a clamping reference potential. The clamping reference is in excess of that which would be applied to the non-inverting input terminal with a low-level differential flag input to the circuit. The circuit develops a comparator trip point output level when low-level flag input is applied, with the amplifier operating in normal linear mode at signal levels which do not effect a clamp of the operational amplifier inverting input signal. A comparator trip point output level is effected by high level flag input which is sufficient to clamp the operational amplifier inverting input potential and cause the operational amplifier output to swing full positive.

These and other objects and features of the present invention will become apparent when reading the following description with reference to the accompanying drawings in which:

FIG. 1 is a schematic diagram of the flag receiver circuit;

FIG. 2 is a schematic representation of a typical two-wire differential low-level flag input signal source as may be applied to the circuit of FIG. 1, and FIG. 3 is a representation of a single ended high-level flag input as may be applied to the circuit of FIG. 1.

Referring to FIG. 1, the universal flag receiver circuit comprises an operational amplifier 10 connected in differential amplifier configuration. A first input terminal 12 is connected through input resistor 14 to the inverting input terminal 16 of operational amplifier 10. A second input terminal 18 is connected through input resistor 20 to the non-inverting input terminal 22 of operational amplifier 10. Feedback resistor 24 is connected between the output terminal 26 of amplifier 10 and the inverting input terminal 16, and feedback resistor $R_2$ is connected between the amplifier non-inverting input terminal 22 and ground. A load resistor 30 (standard flag 1000-ohm load) is connected across the receiver input terminals 12 and 18.

The output 26 of operational amplifier 10 is applied as input to a voltage comparator 32 which has a predetermined trip point reference input 34. The output 36 of comparator 32 comprises the flag annunciation controlling signal which may be utilized to display a flag warning on an instrument when flag input signals fall below predetermined levels.

A first diode member 38 is connected between the operational amplifier input terminals 22 and 16, while a second diode member 40 is connected between the operational amplifier inverting input terminal 16 and a positive voltage source 42 so as to be reverse-biased by voltage source 42.

The operation and operational significance of the flag receiver circuit may best be comprehended by first considering the two distinctly different flag inputs with which it is compatible.

The ARINC defined low-level differential flag signal is typically developed in circuitries such as shown in FIG. 2, which shows glide slope receiver deviation and flag alarm signal development. Here, the levels of detected 150 cps and 90 cps tones are applied to a bridge arrangement which develops the difference between the two levels as a glide slope deviation signal, while the sum of these levels is developed for flag alarm purposes. As shown in FIG. 2, the flag output is the voltage drop across a resistor and the higher potential output (high) and lesser output potential (low) are floating. Thus, there is a common mode voltage, such that the low output line potential is $V_{cm}$ (for common mode voltage) and the high output line potential $V_{LL}$ is referenced to $V_{cm}$ and becomes $V_{cm}+V_{LL}$. Typical low-level flag signal is 220μa±35μa (into a 1K load).

FIG. 3 depicts a single-ended high level flag signal, typically 18 V to 30 V to maintain flag out of view.

As will be described, the flag receiver of FIG. 1 is compatible with either high or low level flag inputs.

LOW LEVEL FLAG OPERATION

Referring to FIG. 1, when the circuit is used as a low-level flag receiver, the flag input is connected to receiver input terminals 12 and 18. As long as $V_x$ is less than 10 volts, the operational amplifier 10 operates in its normal linear fashion or mode. The equation for the output voltage becomes:

$$V_{out} = (V_{cm} + V_{LL})\frac{R_2}{R_1+R_2} \times \left(1 + \frac{R_2}{R_1}\right) - V_{cm} \times \frac{R_2}{R_1}$$

$$V_{out} = (V_{cm} + V_{LL})\frac{R_2}{R_1} - V_{cm}\frac{R_2}{R_1} = V_{LL} \times \frac{R_2}{R_1}$$

Load resistor $R_L$ does not enter into the equation for the low-level flag operation, since $V_{cm}$ is connected to a low impedance source, and $V_{LL}$ is supplied with respect to $V_{cm}$. If the source of $V_{LL}$ is a current source into $R_L$ rather than a voltage source, then there will be a slight effect due to $R_L$, but this should not be significant since $R_L$ is 1/10 or less the value of $R_1$. $R_L=1K$ (standard low level flag load).

Now, if a low level flag trip level for $V_{LL}=220\mu a \pm 35\mu a$ into 1K load is to be effected; $V_{LL}=0.22$ volts, nominally.

$$\text{Gain} = \frac{V_{out}}{V_{LL}} = \frac{V_{ref.}}{V_{LL}} = \frac{2.5}{0.22} = 11.4$$

If we let $R_2=301K$, then:

$$\text{Gain} = \frac{R_2}{R_1}\ ;\ R_1 = \frac{R_2}{\text{gain}} = \frac{301}{11.4} = 26.4K$$

Using $R_1=26.1K$, the flag will trip at $$V_{LL} = V_{ref.}\left(\frac{R_1}{R_2}\right) = 2.5\left(\frac{26.1}{301}\right) = 0.216 \text{ volts}.$$

HIGH LEVEL FLAG OPERATION

When used as a high level flag, the flag input is connected to the Flag H side (input terminal 18) and no connection is made to input terminal 12. The output voltage of the operational amplifier is now:

$$V_{out} = \frac{V_{in} \times R_2}{R_1 + R_2}\left(1 + \frac{R_2}{R_1 + R_L}\right) - V_{in} \times \frac{R_2}{R_1 + R_L}$$

$$V_{out} = \frac{V_{in} \times R_2 R_L}{(R_1 + R_2)(R_1 + R_L)}$$

Since $R_2 >> R_1$ and $R_1 >>> R_L$:

$$V_{out} \approx \frac{V_{in} R_L}{R_1} = \frac{1000 \, V_{in}}{26.1K} = 0.038 \, V_{in}$$

As $V_{in}$ increases, the voltage $V_x$ on the inverting input terminal 16 of the operational amplifier 10 rises, and at the point where the summing junction reaches approximately 10.4 volts, the input to inverting input terminal 16 of the operational amplifier 10 is clamped and causes the operational amplifier output to swing full positive in an attempt to counteract the clamping action. This point then becomes the trip point for the high level flag. Thus:

$$V_x = V_{in}\left(\frac{R_2}{R_1 + R_2}\right) \approx 10.4$$

$$V_{in} \approx 10.4\left(\frac{R_1 + R_2}{R_2}\right) = 10.4\left(\frac{327.1 \, k}{301 \, k}\right) = 11.3$$

and $V_{in}$ for the high level flag trip point is approximately 11.3 volts.

Diode 40 provides the clamping action of the operational amplifier inverting input 16, while diode 38 serves to protect the operational amplifier input from excessive voltage when the non-inverting input is the nominal high level flag voltage of 30 28 volts. The 10-volt clamping reference voltage may be obtained from a zener reference or from an internal voltage in the unit. The 10 volts can be set to give an "optimum" trip point for the high level flag and yet not let the operational amplifier inputs exceed allowable input voltages.

The selection of 10 volts for the clamping reference also sets the maximum common mode input voltage for the low level flag at a level of 10 volts.

When $V_{in}$ is below the high level trip point, the output voltage of the operational amplifier is approximately 11.3 (0.038) = 0.43 volts, which is well below the comparator trip point of 2.5 volts, thus providing ample noise immunity on the high level flag input up to the trip point level.

The present invention is thus seen to provide a flag receiver circuitry for either a low level or a high level flag input. By utilizing the common mode rejection capability that must be incorporated in a differential flag receiver circuit, the same circuit can be connected as a single ended input receiver for a high level flag by effecting a clamp of the inverting input terminal voltage of the differentially configured operational amplifier employed, to then provide a high level flag trip-point output.

Although the present invention has been described with respect to a particular embodiment thereof, it is not to be so limited, as changes might be made therein which fall within the scope of the invention as defined in the appended claims.

I claim:

1. A flag receiver circuitry operable to provide a flag activating output in response to a differential low-level flag input being applied to first and second receiver input terminals and in response to a single-ended high level flag input being applied to said first receiver input terminal; comprising an operational amplifier connected in differential configuration with common-mode input rejection capability, a flag load resistor connected between said first and second receiver input terminals, said first and second receiver input terminals connected through like-valued input resistors to the respective non-inverting and inverting inputs of said operational amplifier, said operational amplifier, in response to said low-level flag input being applied to said first and second receiver input terminals, developing a trip point definitive output in response to a predetermined low-level flag input level;

means for clamping the voltage level on the inverting input to said operational amplifier, said operational amplifier being responsive to said high level flag input being applied to said first receiver input terminal to develop said trip point definitive output, said clamping being effected at a level in excess of the level on said inverting input when said low-level flag input is applied to said first and second receiver input terminals.

2. The flag receiver circuitry defined in claim 1, wherein the output of said operational amplifier is applied as a first input to a voltage comparator, a reference level voltage applied as a second input to said comparator, with said flag trip level being outputted from said comparator when the output of said operational amplifier is greater than said reference voltage level.

3. The flag receiver circuitry defined in claim 2, wherein said input resistors are of substantially greater value than that of said load resistor.

4. The flag receiver circuitry defined in claim 3, wherein said operational amplifier comprises a first feedback resistor connected between the output of said operational amplifier and the inverting input terminal thereof and a second like-valued feedback resistor connected between the non-inverting input terminal of said operational amplifier and common ground, with the ratio of said feedback resistor value to said input resistor value being substantially greater than the ratio of said load resistor value to said input resistor value.

* * * * *